(12) United States Patent
Boerner

(10) Patent No.: US 8,358,062 B2
(45) Date of Patent: Jan. 22, 2013

(54) ELECTROLUMINESCENT DEVICE

(75) Inventor: Herbert F. Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/146,940

(22) PCT Filed: Jan. 27, 2010

(86) PCT No.: PCT/IB2010/050360
§ 371 (c)(1),
(2), (4) Date: Jul. 29, 2011

(87) PCT Pub. No.: WO2010/089679
PCT Pub. Date: Aug. 12, 2010

(65) Prior Publication Data
US 2011/0285278 A1  Nov. 24, 2011

(30) Foreign Application Priority Data

Feb. 5, 2009  (EP) .................................... 09152169
Feb. 5, 2009  (EP) .................................... 09152170
Apr. 29, 2009  (EP) .................................... 09159044

(51) Int. Cl.
  *H01L 51/52*  (2006.01)
(52) U.S. Cl. .................. 313/504; 313/503; 313/512
(58) Field of Classification Search .............. 257/40, 257/59, 72, 83, 88, 98–100, 499–508, 642–643, 257/690–693, 700, 759, E51.022, E21.523, 257/E21.59; 313/498–512; 315/169.1, 169.3; 427/58, 64, 66, 532–535, 539; 428/690–691, 428/917; 438/26–29, 34, 82, 455; 445/24–25
See application file for complete search history.

(56) References Cited

U.S. PATENT DOCUMENTS
2008/0087903 A1 * 4/2008 Stoyan ............................ 257/88

FOREIGN PATENT DOCUMENTS
| | | |
|---|---|---|
| DE | 102007004509 A1 | 5/2008 |
| EP | 1939952 A2 | 7/2008 |
| JP | 2006040802 A | 2/2006 |
| WO | 2007013001 A2 | 2/2007 |
| WO | 2008090493 A1 | 7/2008 |
| WO | WO 2008090493 A1 * | 7/2008 |
| WO | 2009001241 A1 | 12/2008 |
| WO | 2009125696 A1 | 10/2009 |

* cited by examiner

*Primary Examiner* — Mariceli Santiago
*Assistant Examiner* — Donald Raleigh
(74) *Attorney, Agent, or Firm* — Mark L. Beloborodov

(57) ABSTRACT

The invention relates to an electroluminescent device (10) comprising a layer system with a substrate electrode (20) on top of a substrate (40) and at least one stack of subsequent layers comprising a counter electrode (30) and an electroluminescent layer stack with at least one organic electroluminescent layer (50) wherein the electroluminescent layer stack is arranged between the substrate electrode (20) and the counter electrode (30), and at least one electrical shunt means (122, 122', 122") applied to the top of the substrate electrode (20) to improve the current distribution over the substrate electrode (20), characterized in that the electrical shunt means (122, 122', 122") is applied to the substrate electrode (20) via at least one electrical connecting means (120), whereas the electrical connecting means (120) and the shunt means (122, 122', 122") are arranged outside the stack of subsequent layers. The invention further relates to a method for shunting a substrate electrode of an electroluminescent device by an electrical shunt means.

12 Claims, 12 Drawing Sheets

ELECTROLUMINESCENT DEVICE

FIELD OF THE INVENTION

The invention relates to an electroluminescent device comprising a layer system with a substrate electrode on top of a substrate and at least one stack of subsequent layers comprising a counter electrode and an electroluminescent layer stack with at least one organic electroluminescent layer, wherein the electroluminescent layer stack is arranged between the substrate electrode and the counter electrode. To improve the current distribution over the substrate electrode, at least one electrical shunt means is applied to the top of the substrate electrode. Moreover, the present invention is directed to a method for shunting a substrate electrode of an electroluminescent device by an electrical shunt means.

BACKGROUND OF THE INVENTION

In the WO 2007/013 001 A2 an organic light emitting diode (OLED) is described. The organic light emitting diode consists of a thin layer of approximately 100 nm of organic substances, sandwiched between two electrodes. The electrode layers normally possess a thickness approximately equal to the thickness of the organic substance. When a voltage—typically between 2 and 10 volts—is applied between the two electrodes, the organic substances emit light. Unfortunately, due to its small thickness the resistance of such electrodes is high, so that it is difficult to achieve a homogeneous distribution of the voltage over the area of the electrode. To eliminate this disadvantage, conducting posts are applied to the counter electrode of the OLED. However, the counter electrode is made of a reflective metal, which has a low resistance and which therefore causes only a minor voltage drop across the counter electrode area. The current distribution of such an OLED is mainly determined by the properties of the transparent substrate electrode, which is not improved by the posts. These conducting posts are connected to an encapsulation means, encapsulating the stack of layers formed by the electrodes and the electroluminescent layer. Unfortunately, the organic layers and the counter electrode are very sensitive. Therefore, connecting the conducting posts with the counter electrodes often leads to electrical shorts. These shorts may for example emerge due to local destruction of the soft organic layers, bringing the counter electrode and the substrate electrode into direct contact.

In the WO 2009/001241 A1 a further organic light emitting diode (OLED) is described. The electroluminescent device comprises a substrate having a substrate electrode and a plurality of mutually spaced apart electrical shunt means, each being in direct electrical contact with the substrate electrode, with an electroluminescent layer stack provided on top of the substrate electrode and the shunt lines, and a counter electrode is arranged on top of the electroluminescent layer stack. The electrical shunt means are provided in direct electrical contact with said substrate layer in order to make the voltage distribution across the substrate layer more homogenous during operation of the electroluminescent device. The resulting topology of the flat substrate electrode with local shunt lines on top deviates from a flat topology disturbing the performance of the subsequent layers covering said substrate electrode with shunt lines, eventually leading to shorts destroying the OLED device. Furthermore the application of material deposition techniques or material printing techniques for manufacturing the electrical shunt means on the surface of the substrate electrode is basically laborious and expensive.

SUMMARY OF THE INVENTION

Thus, the invention has as its objective to eliminate the above mentioned disadvantages. In particular, it is an object of the invention to provide an electroluminescent device disclosing an improved application of electrical shunt means electrically connected to the substrate electrode leading to a more reliable and cheaper electroluminescent device.

This objective is achieved by an electroluminescent device comprising a layer system with
a substrate electrode on top of a substrate and at least one stack of subsequent layers comprising a counter electrode and an electroluminescent layer stack with at least one organic electroluminescent layer wherein the electroluminescent layer stack is arranged between the substrate electrode and the counter electrode, and at least one electrical shunt means applied to the top of the substrate electrode to improve the current distribution over the substrate electrode, characterized in that the electrical shunt means is applied to the substrate electrode via at least one electrical connecting means, whereas the electrical connecting means and the shunt means are arranged outside the stack of subsequent layers.

Advantageous embodiments of the electroluminescent device are defined in the subclaims.

The invention discloses at least one electrical shunt means, which is applied to the substrate electrode via at least one electrical connecting means, whereas the electrical connecting means and the shunt means are arranged outside the stack of subsequent layers.

The leading idea of the present invention is to apply the electrical connecting means and the electrical shunt means outside the stack of subsequent layers, namely the organic electroluminescent layer and the counter electrode, maintaining a flat topology of these layers. According to the invention, the electrical connecting means and the electrical shunt means are performed as single conductive elements, applied to the substrate electrode, arranged outside the stack of subsequent layers. Basically the electrical shunt means can form an electrical connection between an electrical power source and a connecting point on top of the substrate electrode. In particular, electrical shunt means are preferably arranged between two electrical connecting means, arranged within the emitting field of the electroluminescent device and a border area and whereas the voltage of the border area of the substrate electrode is equalized. As a result, the use of single conductive elements to connect the border area of the substrate electrode to the electrical connecting means within the emitting area of the device lead to a more homogenous voltage distribution across the substrate electrode. Thus, the intensity of emitted light is also more homogenous than without the shunt means.

In the context of the invention the notion electroluminescent (EL) layer stack denotes all layers prepared between the substrate and counter electrodes. In one embodiment of the EL layer stack, it comprises at last one light emitting organic electroluminescent layer prepared between the substrate and the counter electrode. In other embodiments the layer stacks may comprise several layers prepared between the substrate and the counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. In a preferred embodiment the substrate electrode and/or the counter electrode comprise at least one of the following materials: ITO, aluminum, silver, doped ZnO, an oxide layer.

In the context of the invention the notion substrate material denotes a base material onto which the different layers of the electroluminescent device are deposited. Normally, the substrate is transparent and is made of glass. Furthermore, it may be preferable that the substrate is transparent, preferably comprising at least one of the following materials: silver, gold, glasses or ceramics. It may also be made of transparent polymer sheets or foils with a suitable moisture and oxygen barrier to essentially prevent moisture and/or oxygen entering the electroluminescent device layer stack. It is also possible to use non-transparent materials like metal foils as the substrate. The substrate may comprise further layers, e.g. for optical purposes like light out-coupling enhancement or other purposes. The substrate is usually flat, but it may also be shaped into any three-dimensional shape that is desired.

In the context of the invention the notion substrate electrode denotes an electrode deposited on top of the substrate. Usually it consists of transparent ITO (Indium-Tin Oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers (8-15 nm thick) are used single or in combination with ITO as the substrate electrode. If a metal foil is used as the substrate, it takes also the role of the substrate electrode, either anode or cathode. The notation on-top-of denoted the sequence of the listed layers. This notation explicitly comprises the possibility of further layers in between the layers denoted as on top of each other. For example, there might be additional optical layers to enhance the light out-coupling arranged between the substrate electrode and the substrate.

In the context of the invention the notion counter electrode denotes an electrode away from the substrate. It is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers.

In the context of the invention an electroluminescent device with a combination of a transparent substrate, a transparent substrate electrode and a non-transparent counter electrode (usually reflective), emitting the light through the substrate is called "bottom-emitting". In case of an electroluminescent device comprising further electrodes, in certain embodiments both substrate and counter electrodes could be either both anodes or both cathodes, when the inner electrodes are driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and the encapsulation means are transparent. Here the electroluminescent device is both, bottom and top-emitting. In the context of the invention a layer, a substrate or an electrode is called transparent if the transmission of light in the visible range is more than 50%; the rest being absorbed or reflected. Furthermore, in the context of the invention a layer, a substrate or an electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

Furthermore, in the context of the invention a layer, connector or construction element of an electroluminescent device is called electrically conducting if its electrical resistance is less than 100000 Ohm. In the context of the invention passive electronic components comprise resistors, capacitors and inductivities. Furthermore, in the context of the invention active electronic components comprise diodes, transistors and all types of integrated circuits.

In the context of the invention a layer, a substrate, an electrode or a construction element of an electroluminescent device is called reflective if light incident on its interface is returned according to the law of reflection: the macroscopic angle of incidence equals the macroscopic angle of reflection. Also the term specular reflection is used in this case. Furthermore, in the context of the invention a layer, a substrate, an electrode or a construction element of an electroluminescent device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

Advantageously, the stack of subsequent layers comprises an open area in order to feed through the shunt means in a way that the electrical connecting means is encircled by the stack of subsequent layers. In order to avoid a short between the substrate electrode and the counter electrode, a distance between the electrical connecting means on top of the substrate electrode and the counter electrode as well as the organic electroluminescent layer is necessary. Said open areas can be formed as circles in the stack of subsequent layers encircling the electrical connecting means. Moreover, the electrical shunt means in form of a wire, a metallic stripe or foil can pass the organic electroluminescent layer and the counter electrode. The connecting means simultaneously acts as a mechanical stabilization of the applied shunt means against undesired movements in order to prevent a short between shunt means and counter electrode. The arrangement of the electrical connecting means and the shunt means outside the stack of subsequent layers means that the arrangement is performed on the far side of substrate electrode relating to the stack of subsequent layers, namely on the back side OLED and not within the layers, but nevertheless the shunting forms an electrical connection to the substrate electrode.

According to yet another advantageous embodiment of the present invention the electrical connecting means comprises electrical conductive glue for electrically contacting the shunt means to the substrate electrode. Said conductive glue forming the electrical connecting means comprises a matrix and a filler, whereas the conductive glue comprises organic materials as the matrix and inorganic materials as the filler. In one embodiment, the conductive glue may comprise at least one of the following matrices: epoxies, polyurethanes or silicones. The filler and/or the matrix have to be conductive to conduct the electrical current from the electrical source to the counter electrode.

Therefore, it is preferred, that the conductive glue and/or the filler comprise conductive flakes or particles. The filler particles must possess low resistance, stability and durability. Therefore, it is preferred that the filler comprises flakes or particles of at least one: Silver, Gold, Nickel, Platinum, Copper, Palladium or other metals or other non-metals like Carbon, glassy Carbon, Graphite, Carbon nanotubes, doped ZnO, SnO, electrical conductive nitrides, electrical conductive borides, metal covered glass or plastic beads, metal covered glass or plastic hollow beads or metal or graphite particles covered with copper, gold or silver.

In a preferred embodiment the conductive glue is anhydrous and/or water free. In the context of the invention, the notion water free and/or anhydrous describes the fact, that no degradation due to water content during the average lifetime of an electroluminescent device can be observed by the naked eye. A visible degradation of the organic electroluminescent layer due to water diffusing into the layer stack can take the form of growing black spots or shrinkage of the emissive region from the edges. The notion water free and/or anhydrous not only depends on the conductive glue itself but also on the amount of water, which can be absorbed by the organic electroluminescent layer without damaging it.

In a further preferred embodiment the electroluminescent device may comprise moisture and/or oxygen barriers. In the context of the invention layers prevention harmful diffusion of moisture and/or oxygen into the layer stack are called moisture and/or oxygen barriers. A diffusion is denoted as harmful if a significant life-time reduction of the emitted light can be observed. Standard OLED devices according to the state of the art achieve shelf life times in the order of 100000 hours or more. A significant reduction denotes a reduced life-time of about a factor of 2 or more.

In its preferred embodiment the electrical connecting means is embedded in an electrical non-conductive protective means, applied to the substrate electrode, whereas the protective means preferably comprises electrical non-conductive glue. When the electrical connecting means is embedded within an electrical non-conductive protective means the occurrence of an electrical short is avoided. When the electrical connecting means comprises conductive glue and the protective means comprises non-conductive glue, different layers of glue are applied onto each other.

The substrate electrode may feature a contacting area, which is arranged in the border area of the electroluminescent device. Thus, the electrical connection means may be applied to the substrate electrode within the contacting area. The contacting area may comprise an additionally applied conductive material to increase the electrical conductivity of the substrate electrode in said contacting area. Moreover, the electrical connection of the substrate electrode to an external power source can be performed via said contacting area. When the contacting area is arranged encircling the light emitting field of the electroluminescent device, the voltage at the circumference of the substrate electrode is uniform. When the electrical shunt means comprises electrical interconnections between several contacting posts within the light emitting area and the contacting area, namely when the connecting means are applied on the additional applied conductive material, the voltage distribution across the entire light emitting field is much more uniform.

In its preferred embodiment, the electrical shunt means comprises a metallic wire, a metallic stripe or a metallic foil, preferably made of copper, gold and/or silver, a deposited conductive material or a printed circuit board. The copper forming the electrical shunt means can be selected within usual copper based alloys used for electrical conductors as known to a person skilled in the art. When said conducting elements are manufactured by die-cutting, a cheap mass-production technique can be used for forming the shunt means, in particular when the shunt means are arranged in a grid-form, and the entire grid can be finished by only a few die strokes or in particular only one die stroke.

In its preferred embodiment the electroluminescent device may comprise at least one contact means for electrically contacting the counter electrode to an electrical power source, whereas said contact means preferably performed as conductive glue, applied to the counter electrode and whereas a protective means is preferably arranged on the substrate electrode, wherein the protective means is electrical non-conductive glue and is at least fully covering the area below the contact means.

Conductive glue is soft in its initial state, so it can be applied to the counter electrode without exerting locally high pressure to the counter electrode. Thus, there is no risk that a short between the counter electrode and the substrate electrode raises during application of the glue. This leads to the advantage that a three-dimensional contact schema with a minimum risk of shorts is provided.

Usually, conductive glue consists of organic glue with conductive filler in the form of conductive flakes or particles. During the setting of the glue, the glue may display a certain shrinkage, and which lead to forcing some of the filler particles into the underlying layers, creating shorts between the substrate electrode and the counter electrode. To prevent this, it is advantageous to use glue with a lesser shrinkage and a higher elasticity like silicones and/or to make the counter electrode thicker.

A further advantage achieved by the usage of conductive glue as a contact means is, that a substrate with only one contiguous electrode can be used, which serves as a substrate electrode for the electroluminescent device. In known OLEDs, the electrode on the substrate is at least structured into two electrical separate regions: one serving as the substrate electrode and the other one connected to the counter electrode. Thus both the substrate and the counter electrode are led in one plane to the rim of the substrate, where they can be contacted by standard means. The disadvantage of this 2-dimensional contacting scheme is that the substrate electrode as well as the counter electrode have to share the periphery of the OLED for contacting, so that the electrode on the substrate needs to be divided into at least two disjoint regions (substrate electrode and second electrode to be contacted with the counter electrode) to avoid shorting the device. The disclosed 3-dimensional contacting eliminates this serious disadvantage of the 2-dimensional contacting.

The arrangement of the electrical non-conductive protective means at least fully covering the area below the contact means leads to the advantage that shorts between the substrate electrode and the counter electrode are avoided during the hardening of the glue.

If no restriction on the type of glue is desired, and if the counter electrode cannot be made thicker, said non-conductive protective means is applied to the substrate electrode to prevent a possible short due to the conductive glue. The use of at least one protective means makes the electroluminescent device completely insensitive to the specific properties of the conductive glue. Therefore, all known conductive glues can be used for contacting the counter electrode to an electrical source. The protective means has to cover the full area where the contact means is applied to the counter electrode, since this might be the source of shorts, but it could also be larger than the area of the contact means. To prevent a direct contact between the counter electrode and the substrate electrode, it is preferable that the protective means has a thickness and/or a hardness, which assures that the contact means can not get into electrical contact with the substrate electrode. To achieve this object, the protective means may comprise non-conductive glue and/or a photoresist and/or a lacquer and/or a paint and/or a layer of glass, made of re-melted glass frit. The protective means may also comprise an oxidized metal layer like anodised aluminium. People skilled in the art may choose other electrical non-conductive materials within the scope of the present invention.

The protective means must have properties that on the one hand ensure that it is electrical non-conductive. Furthermore, it must be thick and/or hard enough to shield the substrate electrode from the contact means. The precise thickness and hardness depend on the actual pressure exerted by the contact means, but typically 1-100 micron thickness are sufficient. The desired protection has been achieved with photoresist layers of 1.5 micron thickness as well as with layers of non-conductive glue of 10-200 micron thickness, but thicker layers can also be used. Furthermore, it must be ensured that the protective means does not damage either the substrate electrode, the organic electroluminescent layer nor the counter electrode. In its preferred embodiment the protective means comprises non-conductive glue. Furthermore, it is preferable that the non-conductive glue of the protective means is anhydrous and/or water free. Furthermore, it is preferable that the non-conductive glue of the protective means is anhydrous and/or water free.

Advantageously, the electroluminescent device comprises an encapsulation means, which is arranged for encapsulating at least said electroluminescent layer stack, whereas the electrical contact means is preferably arranged in between said encapsulation means and the counter electrode for electrically contacting the counter electrode to the encapsulation means. The encapsulation means may also encapsulate the whole stack of layers of the electroluminescent device or just a plurality of layers, forming a part of the whole stack of layers. Preferably, the encapsulation means is provided as a gas-tight element, covering at least the organic electroluminescent layer and the counter electrode. By using a gas-tight encapsulation means, it is prevented that environmental factors like water or oxygen damage the encapsulated layers. The encapsulation means may form a gas-tight lid. This lid may be formed of glass or metal. It is also possible to form the encapsulation means by one or a plurality of layers supplied to the electroluminescent device or just parts of it. The layers may comprise silicone, silicone oxide, silicone nitride, aluminum oxide or silicone oxynitride. All the named encapsulation means prevent mechanical and/or environmental factors from affecting the layer stack of the electroluminescent device adversely. As an example, the encapsulation means can be made of metals, glasses, ceramics or combinations of these. It is attached to the substrate by conductive or non-conductive glue, melted glass frit or metal solder. Therefore, it may also provide mechanical stability for the electroluminescent device, whereas at least parts of the applied glue between the layers and the encapsulation means are electrically conducting for contacting the counter electrode.

According to another preferred embodiment the encapsulation means comprises the encapsulation means comprises a top of encapsulation means and a side of encapsulation means electrically insulating the contact means from the substrate electrode, preferably whereas the electrically contacting of the counter electrode to the encapsulation means by said contact means is provided to the at least partly conductive top of encapsulation means. The top of encapsulation means forms a lid, and the side of the encapsulation means encircles the layer system of the electroluminescent device. The side of encapsulation means can be electrically connected to the substrate electrode, and the top of the encapsulation means comprises an electrical interconnection by means of said electrical contact means. Thus, the insulating means forms an electrically insulation between the top of the encapsulation means and the side of the encapsulation means. In order to connect the electroluminescent device to a power source, a current has to be applied to the top and the side of the encapsulation means to operate the electroluminescent device.

In order to ensure the accurate operation of the electroluminescent device, the electrodes must be insulated to each other. When at least one electrode is power supplied via at least a part of the encapsulation means, e.g. by a contact means between the top of encapsulation means and the counter electrode, the remaining part of the encapsulation means must be insulated to the other electrode. When the top of encapsulation means is electrically contacted to the counter electrode, the side of encapsulation means must be insulated to the substrate electrode, e.g. by an insulating rim. When the side of encapsulation means is conductive, the top of encapsulation means can feature an insulating material or at least a locally arranged feed through, in order to pass a conductive element through the top of encapsulation means, which is contacted to the counter electrode. In the case of an electrically interconnection of the side of encapsulation means to the substrate electrode and additionally an electrically contacting of the counter electrode to the top of encapsulation means, the encapsulation means may comprise an insulating means in between the top and the side of encapsulation means.

In one embodiment, the side of encapsulation means is arranged on the substrate electrode by means of a joint means, whereas said joint means comprises electrical conductive glue. Thus, the side of the encapsulation means may comprise an electrical conductive material with a high conductivity, and the substrate electrode has a uniform voltage along the contact area of the substrate electrode formed by the joint means.

By arranging the encapsulation means above the surface of the substrate electrode, different contact possibilities of the shunt means are given. As an example only, a shunt means can be arranged between an electrical connecting means within the light emitting area of the electroluminescent device and the joint means, joining the side of encapsulation means to the substrate electrode. In this case, the joint means fulfils the function of an electrical connecting means in the border area of the electroluminescent device.

According to yet another embodiment, at least one electrical shunt means is arranged between the electrical connecting means and the encapsulation means extending to the at least partly conductive inner surface of the encapsulation means for electrically contacting the substrate electrode via the inner surface of the encapsulation means, preferably the shunt means has a spike form and more preferably the shunt means is attached to the encapsulation means. This shunt means may feature a spike or a needle form, preferably extending essentially orthogonal to the inner surface of the top of encapsulation means towards to the electrical connecting means for electrically contacting the substrate electrode. When the shunt means has the form of a spike or a needle, said shunt means can penetrate into the electrical connecting means, which can consist of electrical conductive glue. With this arrangement, an easy contacting method of one or preferably a plurality of connecting means in form of liquid drops of conductive glue on the surface of the substrate electrode can be realised. When the shunt means is arranged in the encapsulation means the penetration of the plurality of shunt means into a dedicated plurality of drops of conductive glue can be performed at dedicated posts, when the encapsulation means is applied on the backside of the electroluminescent device.

When the top of encapsulation means, hereinafter called the lid, is electrically conductive or features an electrically conductive inner surface, e.g. by means of applied conductive means in the inner surface, e.g. aluminium lines, the electrical shunting may be performed across the entire lid or at least across the main part of the lid, preferably except the feed through for the contacting of the counter electrode. The lid may be electrically connected to the substrate electrode in the circumference of the substrate electrode, e.g. by means of an electrically conductive glue, applied in the circumference. The conductive means may be connected to the substrate electrode in discrete spots, e.g. by drops of electrically conductive glue, arranged between the conductive means and the substrate electrode. The drops of glue may then be arranged in open areas of the stack of subsequent layers.

Within the scope of protection according to the present invention the shunt means can be arranged within the encapsulation cavity, formed by the encapsulation means and defined by the inner area of the encapsulation means and the layer system of the electroluminescent device. That means that the shunt means as well as the connecting means are completely arranged within the cavity, formed by the encapsulation means. In particular, the shunt means as well as the connecting means are arranged between the shunt means and the stack of subsequent layers. The space between the counter electrode and the top of encapsulation means has to be dimensioned in a way, that the electrical shunt means in the form of a wire, a metallic foil, a metallic stripe or a deposited conductive material or a printed circuit board can be arranged within said gap.

Advantageously, the electrical conductive glue forming the electrical connecting means and/or said protective means comprises at least one scattering means at least for scattering light generated by the organic electroluminescent layer. Depending on the material used for the protection means, experiments have shown that the area to which the protection means is applied may appear dark at normal operation of the electroluminescent device, since direct current injection from the counter electrode and the substrate electrode is blocked. Therefore, another preferred embodiment is characterized in that the protective means comprises at least one scattering means for scattering light generated by the organic electroluminescent layer, preferably that the scattering means is embedded in the protective means. This scattering means scatters and/or reflects part of the artificial light guided by the substrate. This results in a brightening of the otherwise non-emissive area. As the substrate often works as a kind of light guide, the scattering means of the protective means enables this light to be scattered and reflected out of the electroluminescent device. The scattering means may be formed by a plurality of pigments and/or flakes embedded in the protective means. This pigments and/or flakes may for example comprise: aluminum, mica effect pigments, titan dioxide particles or other flakes or particles known to a person skilled in the art as scattering and/or reflecting the artificial light of the organic electroluminescent device.

In another preferred embodiment the protective means is dyed. This may be done by coloring the protective means itself or by applying colored pigments to the protective means.

The present invention also relates to a method for electrically shunting a substrate electrode of an electroluminescent device comprising a layer system with a substrate electrode on top of a substrate and at least one stack of subsequent layers comprising a counter electrode and an electroluminescent layer stack with at least one organic electroluminescent layer, wherein the electroluminescent layer stack is arranged between the substrate electrode and the counter electrode, and whereas the method comprises at least the steps of depositing the stack of subsequent layers on top of the substrate electrode, applying at least one electrical shunt means to the substrate electrode via at least one connecting means outside the stack of subsequent layers and arranging said shunt means outside the stack of subsequent layers. In an embodiment the method further comprises the steps of applying at least one further electrical connecting means to the substrate electrode featuring electrical conductive glue, and subsequently arranging said shunt means between the at least two electrical connecting means. The advantage of the method is reached in the improved application of the layers, arranged on top of the substrate electrode. The deposition of the layers is not disturbed by shunt means, which are directly arranged on top of the substrate electrode and which would lead to a uneven topography. Thus, the shunt means as well as the electrical connecting means lead not to edges and shadowing effects in the surface, on which the layers are applied. The layering for manufacturing the electroluminescent device can be finished, before the shunting is performed. The application of the shunt means outside the stack of subsequent layers means, that the shunt means are arranged behind the stack of subsequent layers relating to the substrate.

Features and details described with respect to the electroluminescent device also apply the method and vice versa. The afore-mentioned electroluminescent device and/or method, as well as claimed components and the components to be used in accordance with the invention in the described embodiments are not subject to any special exceptions with respect to size, shape or the material selection. Technical concepts such that the selection criteria are known in the pertinent field can be applied without limitations. Additional details, characteristics and advantages of the object of the present invention are disclosed in the sub claims and the following description of the respective figures, which are an exemplarily fashion only, showing a plurality of preferred embodiments of the electroluminescent device according to the present invention.

BRIEF DESCRIPTION OF THE DRAWINGS

Further embodiments of the invention will be described with respect to the following figures, which show.

DETAILED DESCRIPTION OF THE EMBODIMENTS

Figure 1:
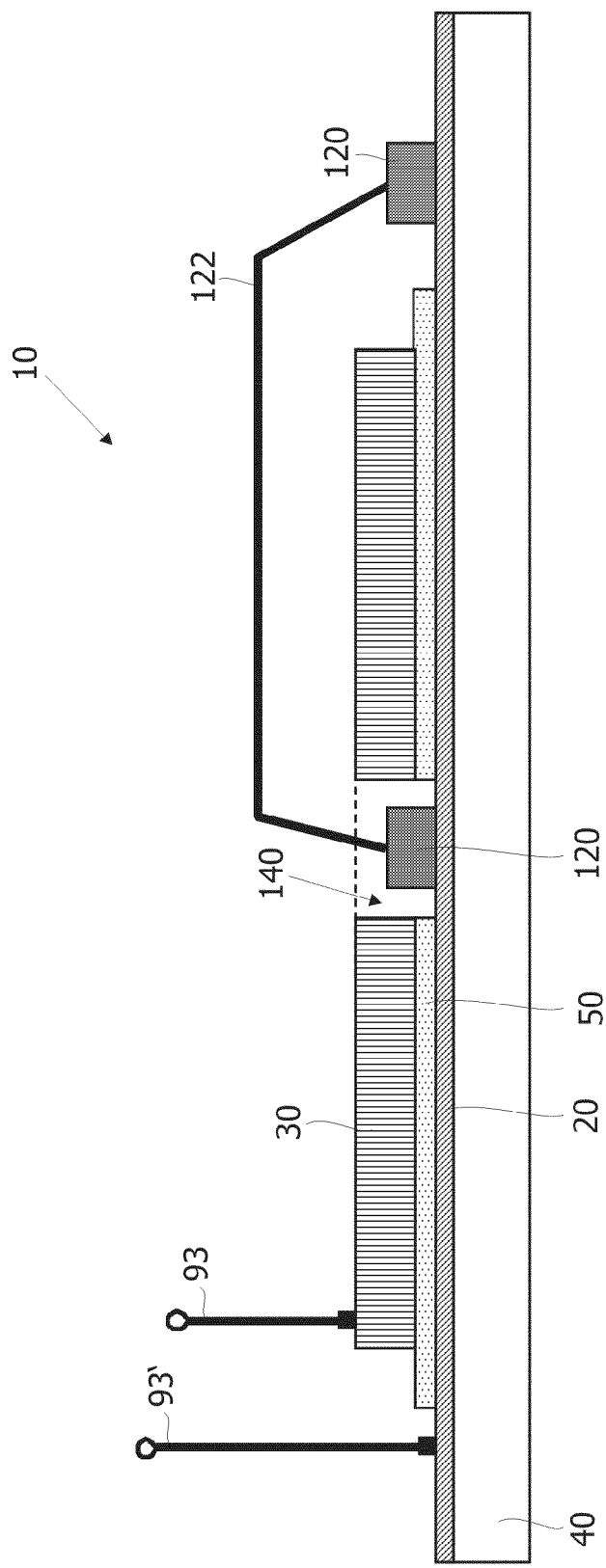
FIG. 1 an embodiment of an electroluminescent device according to the invention with a shunt means shown between two electrical connecting means, FIG. 2 an electroluminescent device comprising two shunt means, FIG. 3a an electroluminescent device comprising an encapsulation means and a contact means, electrically contacted to the top of encapsulation means, FIG. 3b an electroluminescent device, whereas the contact means is applied to a gas-tight feed through, isolated to the top of encapsulation means, FIG. 4 an electroluminescent device with different glue applications, the glue applications comprising scattering means, FIG. 5a an electroluminescent device with a shunt means, performed as a spike form shunt means, FIG. 5b an electroluminescent device with a shunt means, applied in the inner surface of the encapsulation means, FIG. 6 an electroluminescent device with a contacting by means of the encapsulation means and the substrate electrode, FIG. 7 an electroluminescent device comprising several protective means, FIG. 8 a top view of the electroluminescent device comprising shunt means between an electrical connecting means within the light emitting field and the border area of the device, FIG. 9 a top view of the electroluminescent device with several electrical connecting means within the light emitting field and FIG. 10 a top view of the electroluminescent device comprising several counter electrode segments.

In FIG. 1 an electroluminescent device 10 according to an embodiment of the invention is shown. The electroluminescent device 10 comprises a substrate electrode 20, a counter electrode 30 and an organic electroluminescent layer 50 representing the electroluminescent layer stack in this and the following examples. The organic electroluminescent layer 50 is arranged between the substrate electrode 20 and the counter electrode forming a layer stack. This layer stack is arranged on the substrate 40, forming the carrier material of the electroluminescent device 10. In the shown embodiment the substrate electrode 20 is formed by an approximately 100 nm thick layer of ITO, which is a transparent and conductive material. Onto this substrate electrode 20 the organic electroluminescent layer 50 is deposited. If a voltage is applied between the substrate electrode 20 and the counter electrode 30, some of the organic molecules within the organic electroluminescent layer 50 are excited, resulting in the emission of artificial light, which is emitted by the electroluminescent layer 50. The counter electrode 30 is formed by a layer of aluminum, working as a mirror and reflecting the artificial light through the substrate electrode 20 and the substrate 40. To emit light into the surrounding the substrate 40 in this embodiment is made of glass. Thus, the electroluminescent device 10 is a bottom emitting OLED. The electroluminescent device 10 shown in the following figures as well as its components and the components used in accordance with the invention are not shown true to the scale. Especially the thickness of the electrodes 20 and 30, organic electroluminescent layer 50 and the substrate 40 are not true in scale. All figures just serve to clarify the invention.

As shown in FIG. 1 the counter electrode 30 is contacted by a connection means 93 and the substrate electrode 20 is contacted by a connection means 93' in order to power the electroluminescent device 10 by applying a voltage between the connection means 93 and 93'. In order to homogenize the voltage across the entire emitting field of the electroluminescent device 10, an electrical shunt means 122 is arranged on top of the substrate electrode 20. The electrical shunt means 122 is arranged between at least two electrical connecting means 120. At least one of the electrical connecting means 120 is arranged on the border area of the substrate electrode 20, whereas at least a next electrical connecting means 120 is arranged within the emitting field of the electroluminescent device 10, e.g. in the center of the electroluminescent device 10. This shunting of the substrate electrode 20 leads to a homogenization of the voltage across the substrate electrode 20, even though the substrate electrode 20 has a high specific resistance.

In order to arrange at least one electrical connecting means 120 to the substrate electrode 20, the layer system, at least comprising the organic electroluminescent layer 50 and counter electrode 30 feature an open area 140. This open area 140 enables the electrical shunt means 122 to bypass the organic electroluminescent layer 50 and the counter electrode 30 also denoted here as the stack of subsequent layers. Moreover, the electrical connecting means 120 is spaced to the counter electrode 30 in lateral direction in order to prevent the occurrence of shorts. Basically, the electrical connecting means 120 may feature electrical conducting glue, and the glue is applied on the substrate electrode 20 in form of e.g. a liquid drop of glue. When the open area 140 in the organic electroluminescent layer 50 and the counter electrode 30 is performed, the liquid drop of glue only has to be positioned within said open area 140 for electrical contacting the electrical shunt means 122.

Figure 2:
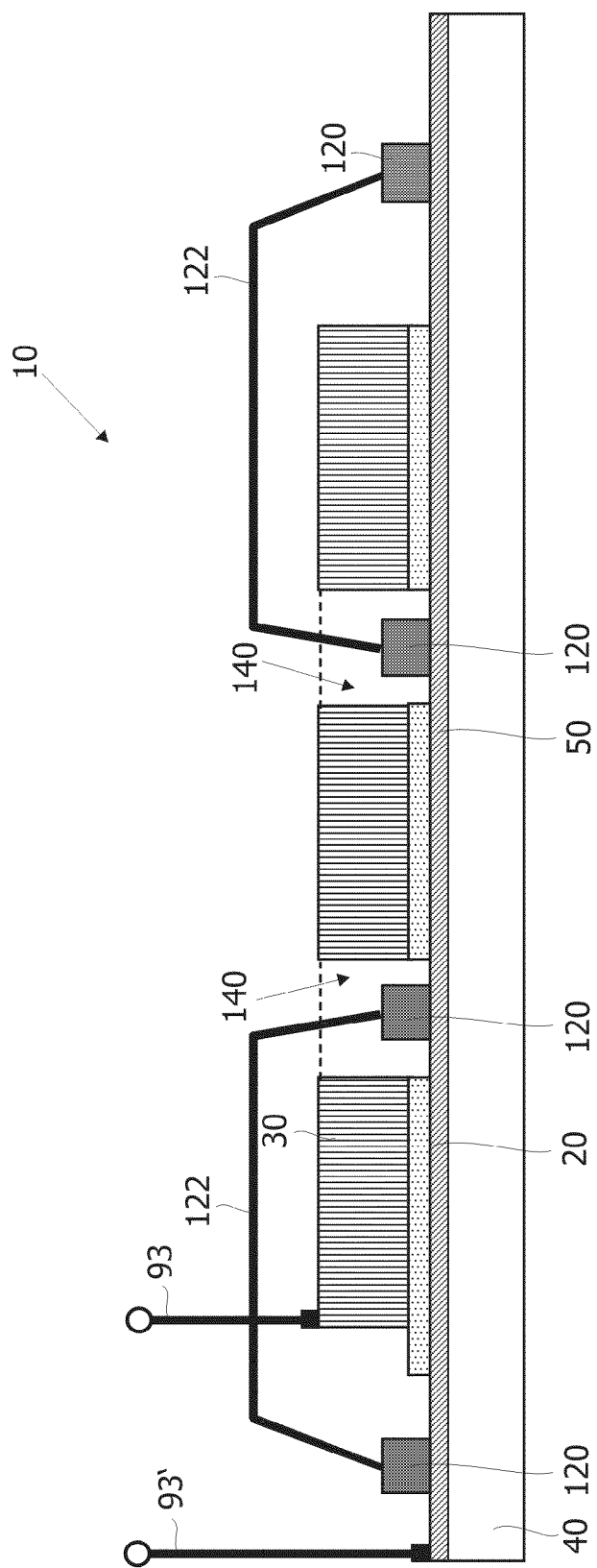

FIG. 2 shows another embodiment of the electroluminescent device 10 comprising two electrical shunt means 122. Both shunt means 122 extend from a border area of the electroluminescent device 10, forming the outer region of the emitting field or at least the area beside the emitting field, to an inner area of the electroluminescent device 10, whereas each electrical contacting in the border area as well as in the inner area of the light emitting field within the substrate electrode 20 comprises an electrical connecting means 120. Each electrical connecting means 120 within the light emitting area of the electroluminescent device 10 is positioned within a dedicated open area 140. As shown, the electrical shunt means 122 is guided outside the stack of subsequent layers at least comprising the counter electrode 30 and the organic electroluminescent layer 50. Thus, the electrical shunt means 122 comprises single conducting elements, which are performed as a kind of electrical jumpers, connecting at least two electrical posts on top of the substrate electrode 20.

For setting the electrical shunt means 122, the layer system comprising said open areas 140 can be finished on top of the substrate 40. In a subsequent step of the method for electrical shunting the substrate electrode 20, the electrical shunt means 122 are applied to the substrate electrode 20 via the connecting means 120, which can be formed by glue drops comprising electrical conducting glue. In its result, the electrical shunt mean 122 may be performed as simple conductive elements outside the layer system and the layering of at least the organic electroluminescent layer 50 and the counter electrode 30 is not disturbed by electrical shunt means 122, which are directly applied on the surface of the substrate electrode 20 according to the prior art.

Figure 3A:
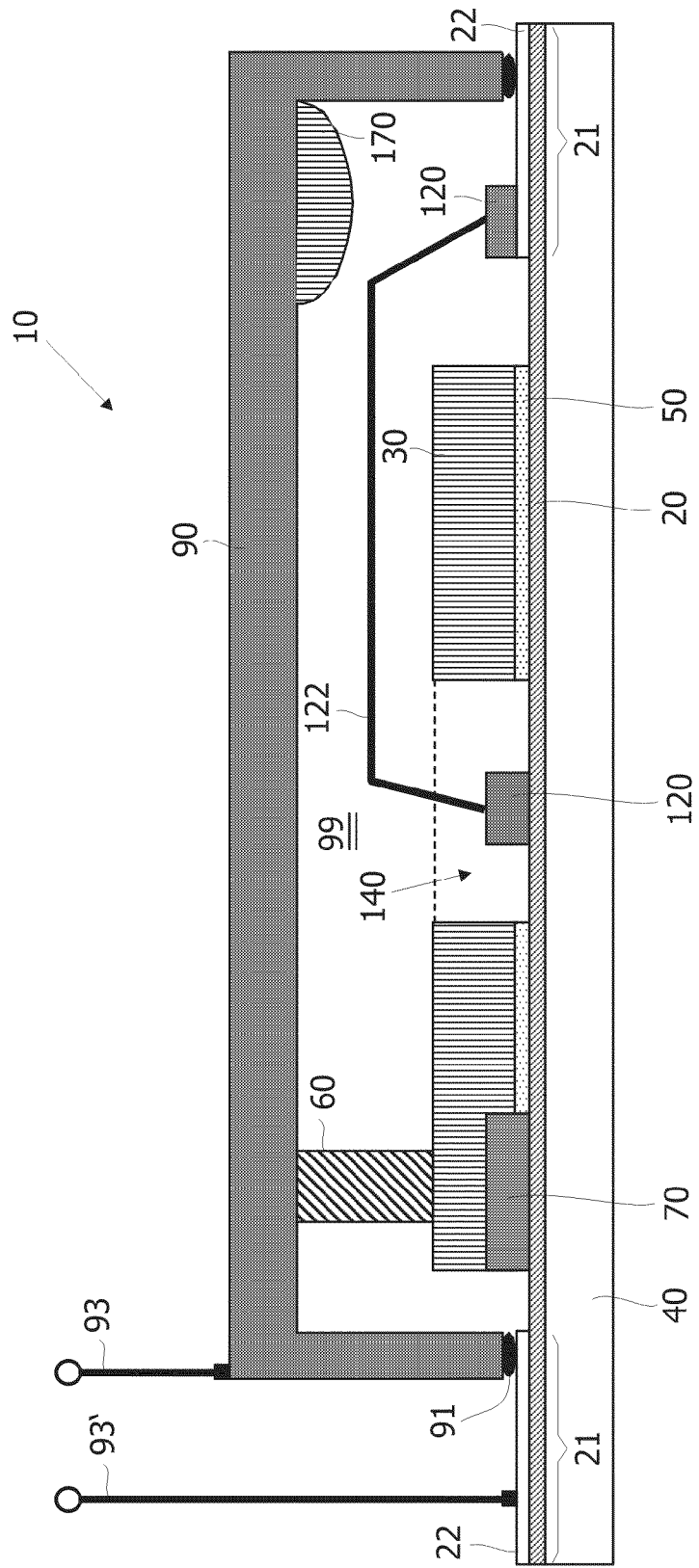

As shown in FIG. 3a the organic electroluminescent layer 50 and the counter electrode 30 are encapsulated by an encapsulation means 90. The encapsulation means 90 comprises a lid-like shape covering the backside of the layer system. The encapsulation means 90 has to be gas-tight to prevent ambient atmosphere from damaging the organic electroluminescent layer 50 or any of the two electrodes 20 and 30, encapsulated within the encapsulation means 90. The shown electroluminescent device 10 furthermore may comprise a getter 170 arranged within the encapsulation means 90. This getter 170 is used to absorb humidity or other damaging gases which tend to diffuse into a protected area within the encapsulation means 90, namely within the encapsulation cavity 99. Thus, the shunt means 122 as well as the connecting means 120 is completely arranged within the cavity 99. The getter 170 may comprise CaO or zeolites. Other materials are known to a person skilled in the art to form a getter 170.

As shown on top of the substrate electrode 20 is applied a contacting area 21, featuring a high conductivity material. This additionally applied conductive material 22 leads to a conductive frame, encircling the light emitting field of the electroluminescent device 10. Thus, the contacting area 21 leads to a homogenized voltage across the border edges of the electroluminescent device 10. As shown, the outer electrical connecting means 120 is positioned on top of the contacting area 21 within the encapsulation cavity 99. The electrical shunt means 122 is arranged between an electrical connecting means 120 in the center of the light emitting field of the electroluminescent device 10 and said electrical connecting means 120 on top of the contacting area 21. As a result, the electrical connecting means 120 induces the same electrical potential in the center of the electroluminescent device 10 compared to the voltage of the contacting area 21 in the border edges of the electroluminescent device 10. Moreover, the contacting area 21 is suited to form an improved current path from to the outside of the encapsulation mean 90 into the encapsulation cavity 99 for contacting the electrical shunt means 122 by means of said electrical connecting means 120.

Moreover, a contact means 60 is arranged for electrically contacting the counter electrode 30 to an electrical power source. The contact means 60 is therefore part of the current path leading from the counter electrode 30 to the electrical source. In the known prior art contact posts are used as contact means 60 which are applied to the counter electrode 30. Such contact posts have the disadvantage that they often lead to shorts between the counter electrode 30 and the substrate electrode 20. To overcome this disadvantage, the contact means 60 comprises electrical conductive glue, applied to the counter electrode 30. Electrical conductive glue can be applied in a gentle manner to the counter electrode 30 so that there is no damage to the counter electrode 30 and the organic electroluminescent layer 50 and/or the electroluminescent layer stack in general leading to a short between the two named electrodes 20 and 30.

The contact means 60 can be performed as electrical conductive glue arranged in direct contact within the counter electrode 30 as well as the inner surface of the encapsulation means 90. Therefore, it is easy to electrically connect the counter electrode 30 to an electrical power source via said encapsulation means 90. The user only has to apply an electrical conductive means to the encapsulation means 90, shown as a connecting means 93. The electrical conductive glue between the encapsulation means 90 and the counter electrode 30 then leads the electrical current to the counter electrode 30. In the shown embodiment the encapsulation means 90 is arranged on top of the additionally applied conductive material 22, which is arranged for power supplying the substrate electrode 20. Thus, an insulating rim 91 is used to arrange the encapsulation means 90 on top of said additionally applied conductive material 22 in an electrically isolated manner.

When conductive glue is used to form the electrical contact means 60 for electrically contacting the counter electrode 30, a preferred embodiment of the disclosed electroluminescent device 10 comprises an electrical non-conductive protective means 70. The electrical non-conductive protective means 70 is arranged at least fully covering the area below the contact means 60. The protective means 70 is arranged on the substrate electrode 20 and can protect the area below the contact means 60. In the depicted electroluminescent device 10 three different kinds of glue are applied: The electrical connecting means 120 comprises electrical conductive glue, whereas said protective means 70 consists of electrical non-conductive glue in order to isolate the area below the contact means 60, forming the third application of electrical conductive glue. Both the shunting of the substrate electrode 20 by means of the electrical shunt means 122 and the contact means 60 are applied within the encapsulation cavity 99, formed by the encapsulation means 90.

Figure 3B:
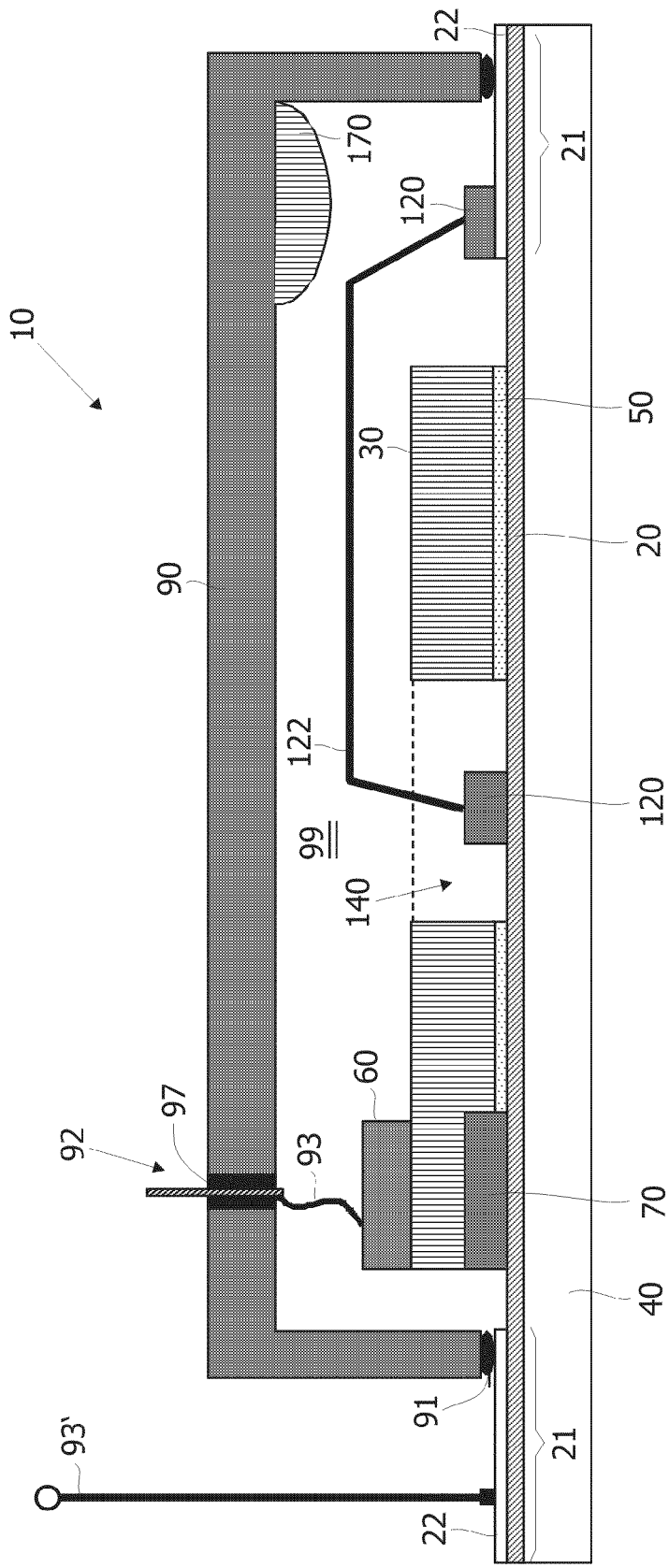

FIG. 3b shows another embodiment of contacting the counter electrode 30 to an electrical power source. In this embodiment the encapsulation means comprises an electrically conductive gas tight feed through 92. This feed through 92 is connected to the contact means 60. This might—as shown—be done by a connection means 93, which is connecting on the one hand the feed through 92 and on the other hand with the contact means 60. The connection means 93 may be a wire, a foil or another electrically conductive element known to a person skilled in the art. It might also be, that the feed through 92 is in direct contact with the contact means 60. So during the mounting of the encapsulation means 90 onto the layer stack, the gas tight feed through 92 might be pressed into the not dried conductive glue of the contact means 60. After hardening there is an electrical contact between the gas tight feed through 92 and the contact means 60. On the outside of the encapsulation means 90, the gas tight feed through 92 may be contacted to an electrical source. In the shown embodiment it is assumed that the encapsulation means 90 as a whole is electrically conductive. Therefore, it is appropriate that the gas tight feed through 92 comprises an insulation means 97. This insulating means 97 prevents any short between the feed through 92—connected to the counter electrode 30—and the encapsulation means 90—connected to the substrate electrode 20. This insulating means 97 may be formed of ceramic, glass or made of remelted glass-frit. If there is no insulating means 97 for the gas tight feed through 92, the top 95 of the encapsulation means 90 may also be insulating. Thus, a short between the two electrodes 20, 30 is also prevented.

Figure 4:
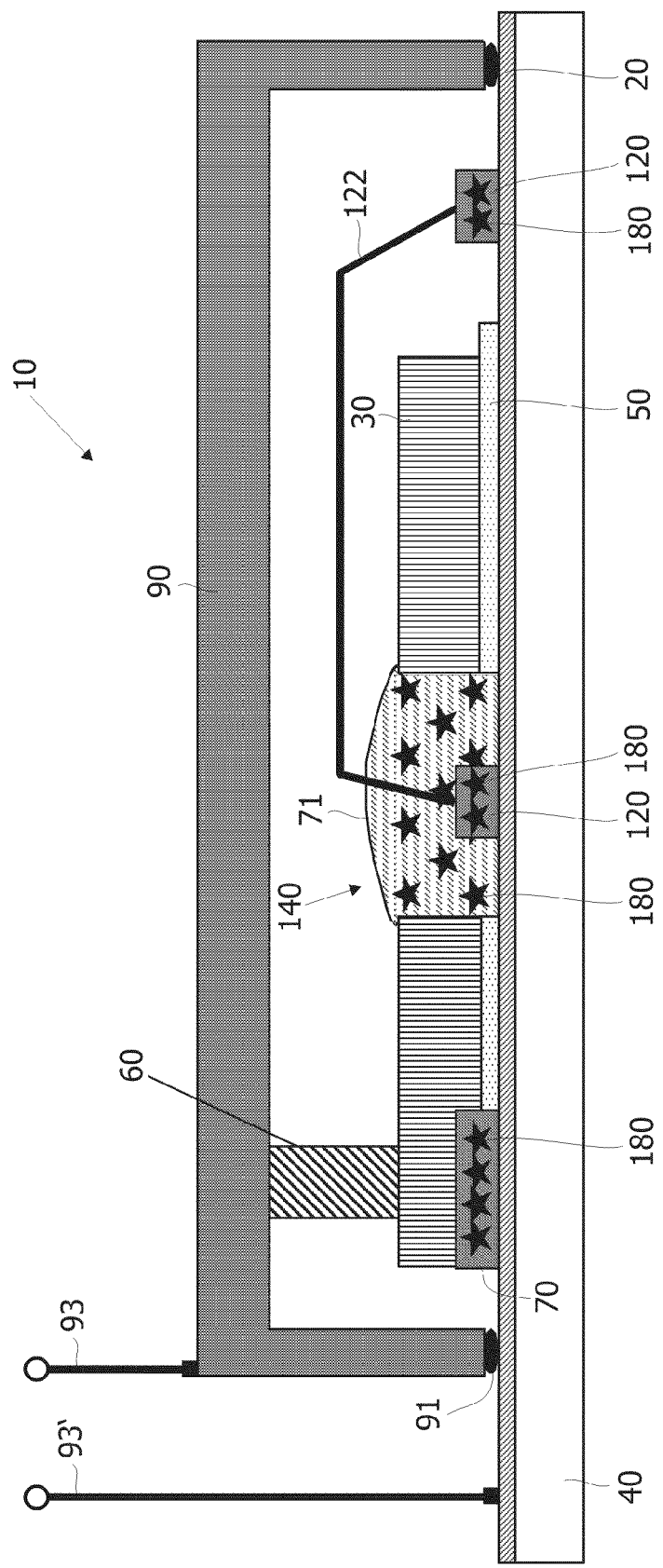

FIG. 4 shows yet another embodiment of an electroluminescent device 10 according to the present invention. Within the open area 140 a protective means 71 is applied and the electrical connecting means 120 is embedded in the protective means 71, comprising electrical non-conductive glue. Thus, a glue-in-glue arrangement is provided and the electrical shunt means 122 is fed through the protective means 71.

According to the shown embodiment, the protective means 70 below the contact means 60 and the protective means 71 within the open area 140 feature at least one scattering means 180 for scattering light generated by the organic electroluminescent layer 50 preferably that the scattering means 180 is embedded within the protective means 70 and 71, respectively. The scattering means 180 scatters and/or reflects part of the artificial light guided by the substrate 40. This results in a brightening of the otherwise non-emissive area, formed by the protective mean 70, 71. As the substrate 40 often works as a kind of light guide, the scattering means 180 of the protective means 70 and 71 enables this light to be scattered and reflected out of the electroluminescent device 10. The scattering means 180 may be formed by a plurality of pigments and/or flakes embedded in the protective means 70 and 71. This pigments and/or flakes may for example comprise: aluminium, mika effect pigments, titan dioxides, particles or other flakes and particles known by a person skilled in the art as scattering and/or reflecting the artificial light of the organic electroluminescent device 10. As a result, the light emitting across the entire light emitting field of the electroluminescent device 10 is homogenized and the open areas 140 (not self-emitting) become invisible. Both the non-conductive glue forming the protective means 70 and 71, respectively, and the conductive glue forming the electrical connecting means 120 may comprise said scattering means 180.

Figure 5A:
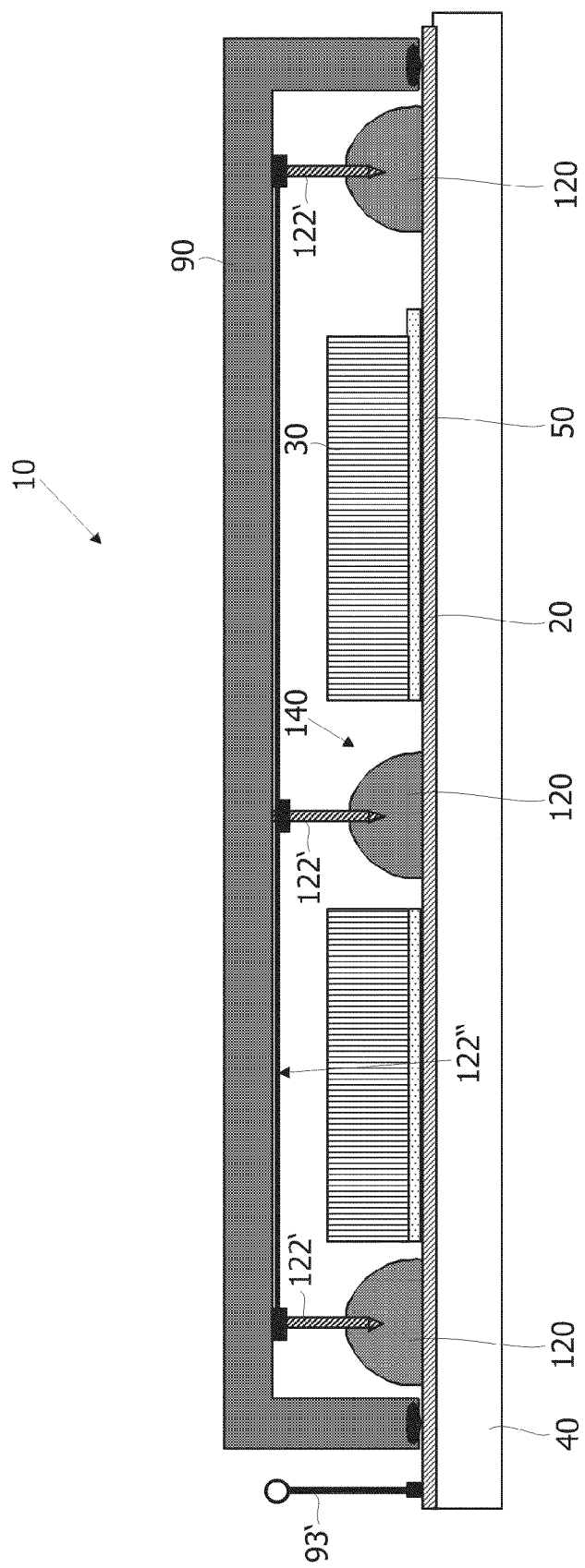

FIG. 5a shows yet another embodiment of the electroluminescent device 10. As shown, shunt means 122' are applied to the substrate electrode 20 by means of electrical connecting means 120, which can be formed by means of a drop of glue on top of the substrate electrode 20 within the open areas 140 and at the circumference of the substrate electrode 20. The shunt means 122' are arranged between the electrical connecting means 120 and at least one shunt means 122", applied in the inner surface of the encapsulation means 90. These shunt means 122" can be performed as conductive stripes in the inner surface of the encapsulation means 90. The shunt means 122' may feature a spike form, extending preferably orthogonal to the inner surface of the encapsulation means 90 towards the electrical connecting means 120, and the shunt means 122' are electrically connected to the shunt means 122". When the encapsulation means 90 is applied to the electroluminescent device 10, the spike-formed electrical shunt means 122' penetrate into the electrical connecting means 120, featuring a resilient electrical conductive drop of glue, and the shunting is finished.

In particular, the shunt means 122" in the inner surface of the encapsulation means 90 may form a printed circuit board, which is shunted to the substrate electrode 20 by means of the shown shunt means 122' in a spike or needle form.

Figure 5B:
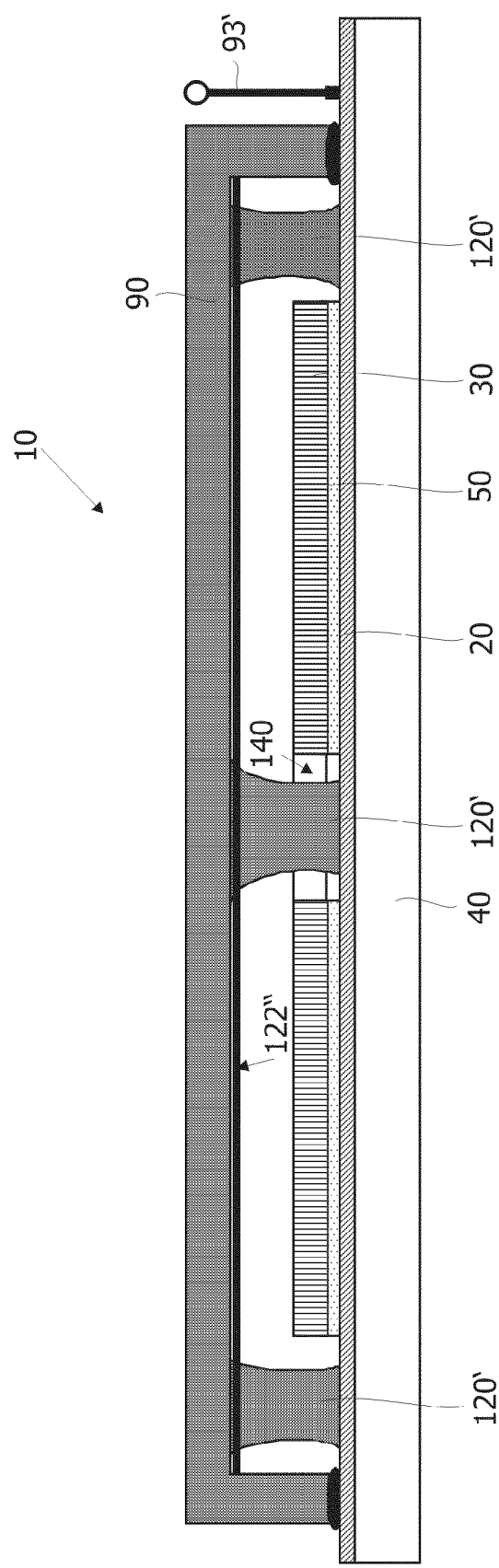

In FIG. 5b the application of shunt means 122" is limited to at least one shunt means 122" in the inner surface of the encapsulation means 90. In this embodiment the electrical connecting means 120' are made of electrical conducting glue, preferably in drops of glue. The drops of glue extend between the substrate electrode 20 and the inner side of the encapsulation means 90, where a shunt means 122" is shown. When at least one electrical connecting means 120' is applied within the emitting field of the electroluminescent device 10 and at least another electrical connecting means 120 is applied in the circumference of the substrate electrode 20, the shunting is performed reliably, when each electrical connecting means 120' is electrically contacted to the shunt means 122" in the inner surface of the encapsulation means 90.

In particular, also in this embodiment the shunt means 122" in the inner surface of the encapsulation means 90 may form a printed circuit board, which is electrically connected to the substrate electrode 20 by means of the shown electrical connecting means 120'.

Figure 6:
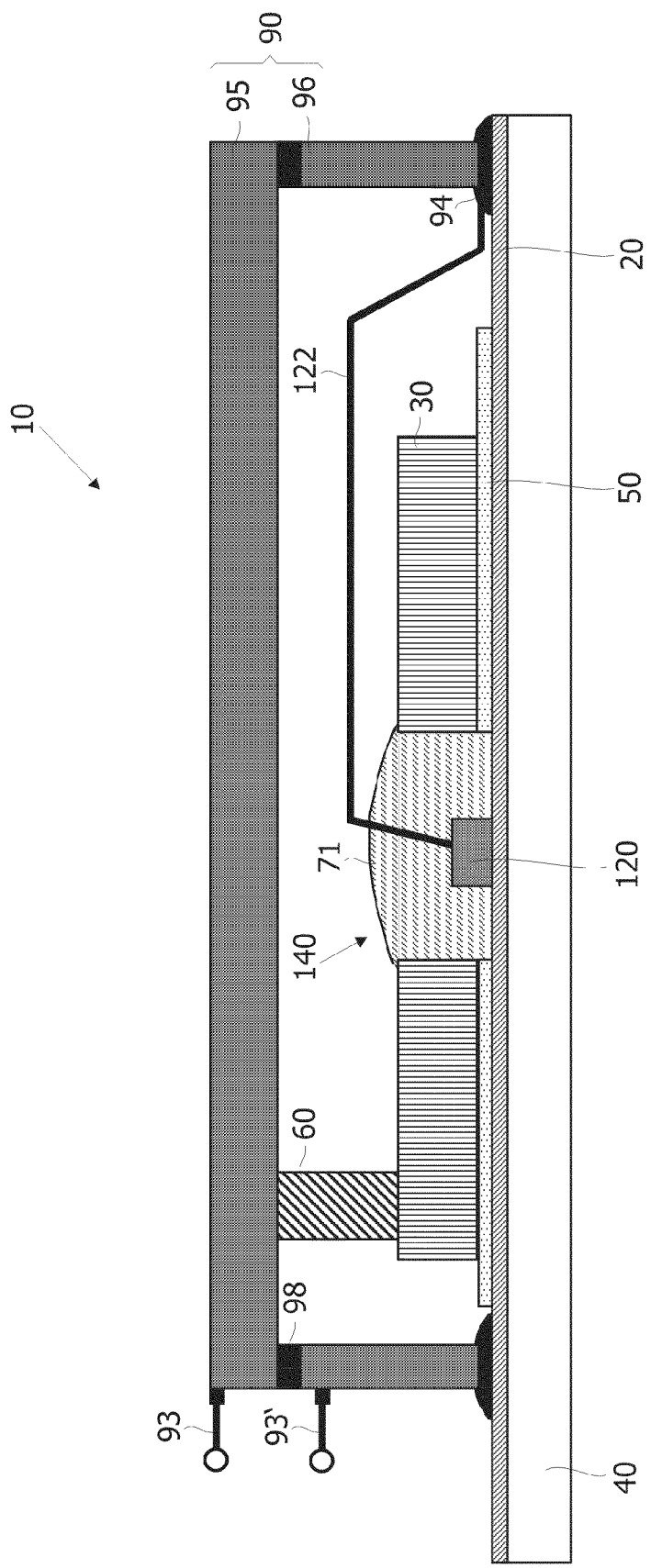

According to the embodiment to the electroluminescent device 10 shown in FIG. 6 the electrical shunt means 122 is contacted in an alternative way to the outer area of the substrate electrode 20. The encapsulation means 90 comprises a top of encapsulation means 95 forming a lid of the top side of the electroluminescent device 10 and a side of encapsulation means 96. In order to form an electrical isolation between the top of encapsulation means 95 and the side of encapsulation means 96, the top and the side 95, 96 enclose an insulating means 98. Thus, the current to operate the electroluminescent device 10 can be applied to the top 95 and the side 96 of the encapsulation means 90 by means of the shown connection means 93 and 93'. In its result, the connecting means 93' is electrically connected to the substrate electrode 20 by means of the shown joint means 94 comprising an electrical conductive agent e.g. made of electrical conductive glue. The top of encapsulation means 95 is electrically connected to the counter electrode 30 by means of the shown contact means 60. In order to shunt the substrate electrode 20 a shunt means 122 is arranged between an electrical connecting means 120 in the center of the emitting field of the electroluminescent device 10 and the joint means 94. The electrical shunt means 122 ends inside the joint means 94, and the end of the electrical shunt means 122 can be glued into the joint means 94. In this way, a simple electrical connecting of the shunt means 122 in the outer area of the electroluminescent device 10 is performed.

Figure 7:
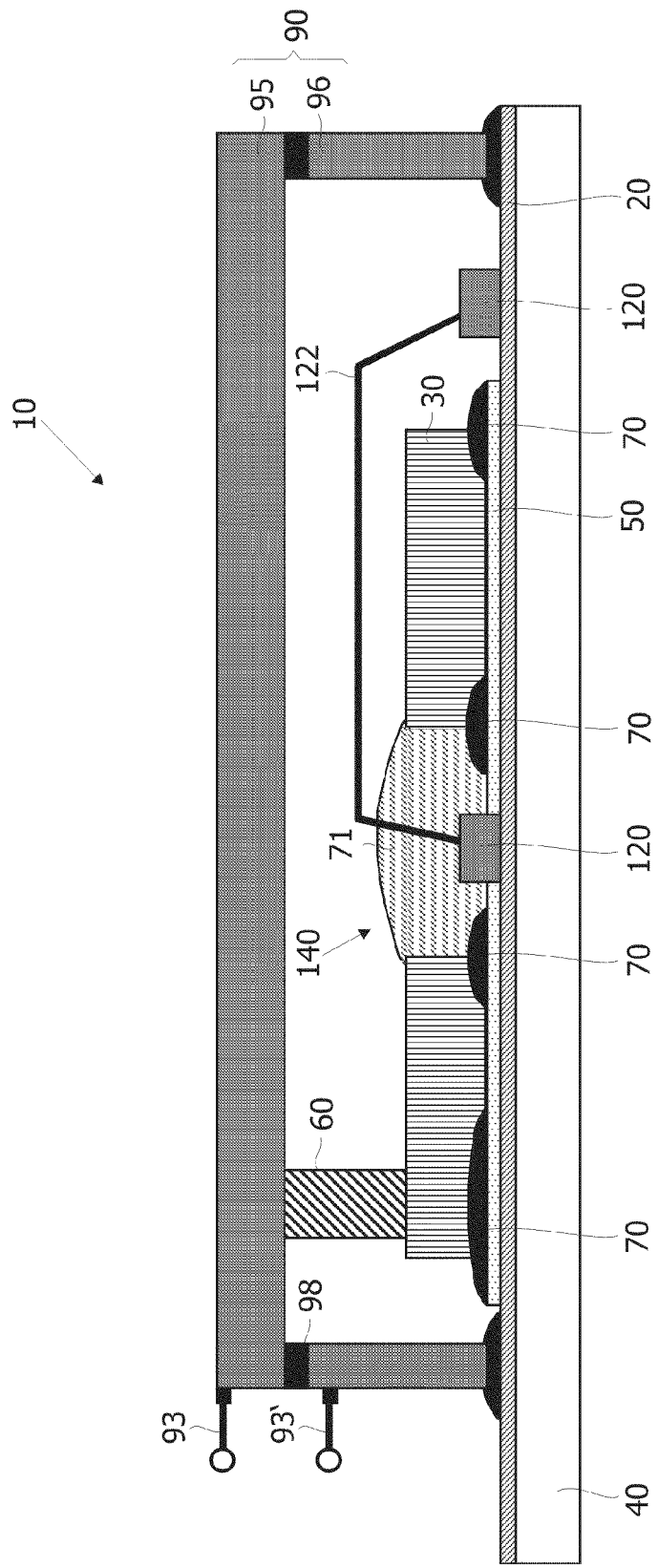

FIG. 7 shows an electroluminescent device 10 with a plurality of protective means 70 preferably arranged in the edges of the counter electrode 30. These protective means 70 may comprise electrical non-conductive glue, preventing a short between the counter electrode 30 and the substrate electrode 20. In particular, the border line of the open area 140 can be protected with the protective means 70, whereas the additional protective means 71 can be applied to embed the electrical connecting means 120 within the open area 140.

Figure 8:
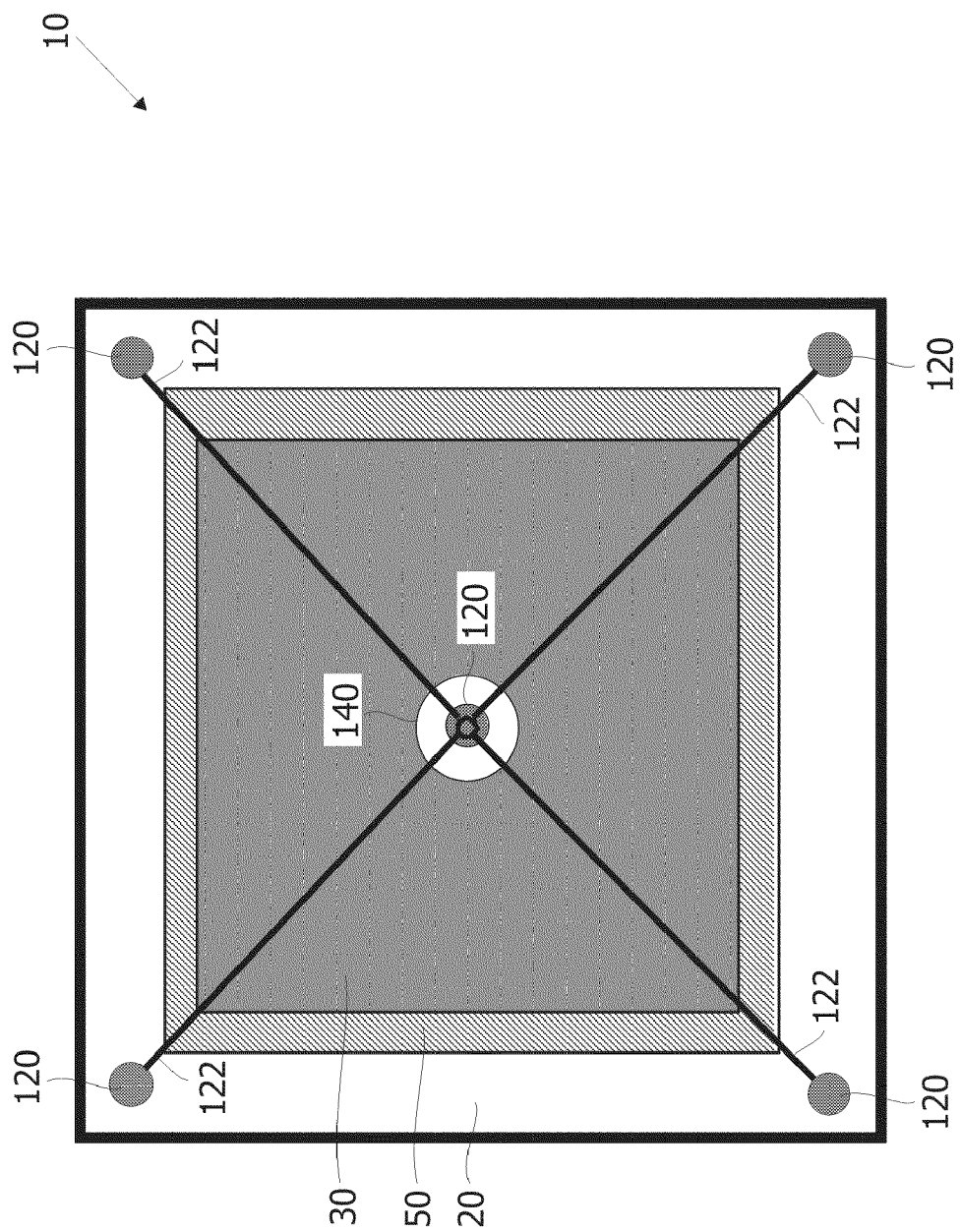

FIG. 8 shows a backside view of the electroluminescent device 10. The shunting of the substrate electrode 20 comprises a first electrical connecting means 120 in the center of the light emitting field of the electroluminescent device 10. The electrical connecting means 120 is connected to four different electrical connecting means 120 in the edges of the electroluminescent device 10. Therefore, four different electrical shunt means 122 are arranged between the outer electrical connecting means 120 and the electrical connecting means 120 in the center of the electroluminescent device 10, in particular within the open area 140.

Figure 9:
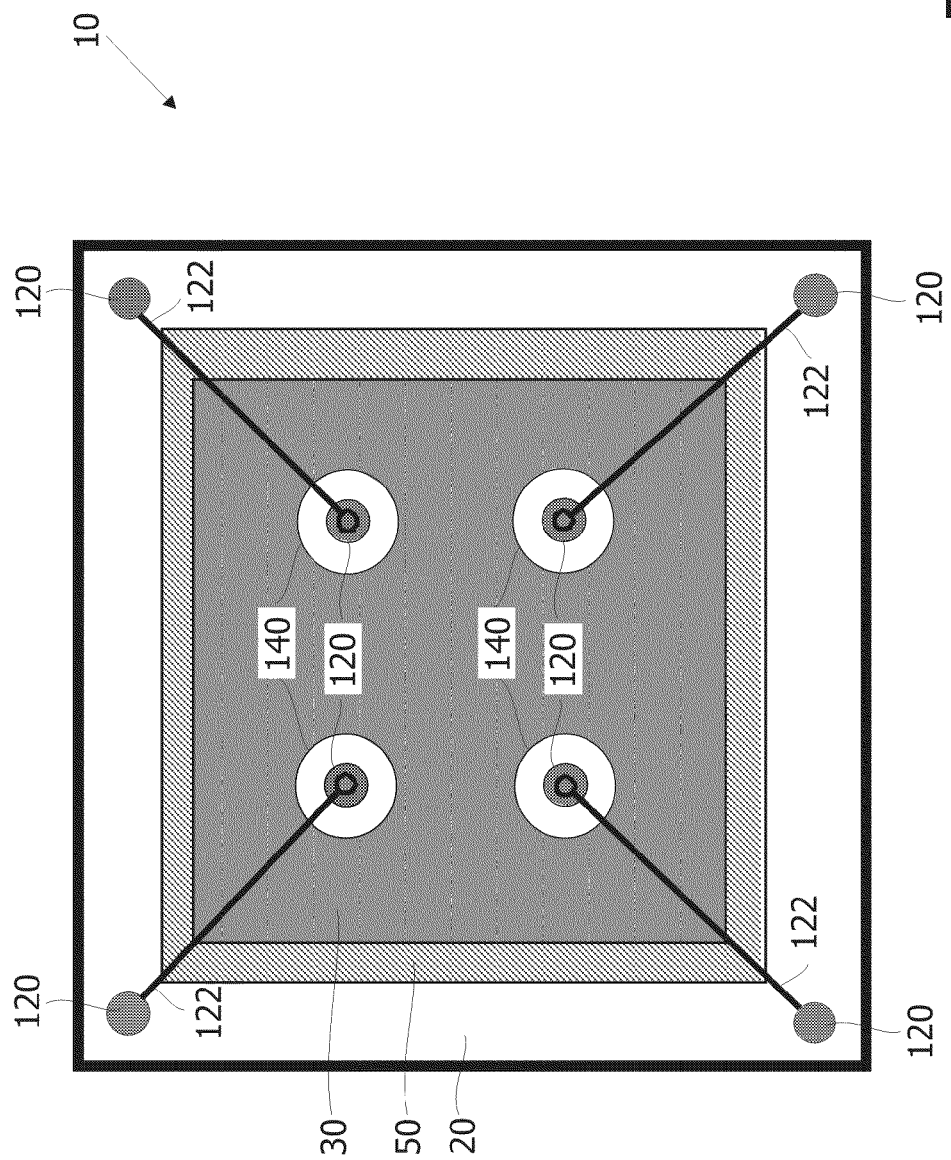

FIG. 9 shows another embodiment of the electroluminescent device 10 comprising four electrical connecting means 120 within the light emitting field of the substrate electrode 20. Each of the electrical connecting means 120 within the light emitting field of the substrate electrode 20 comprises an electrical shunt means 122 for connecting the electrical connecting means 120 to the electrical connecting means 120 in the outer area of the electroluminescent device 10.

Figure 10:
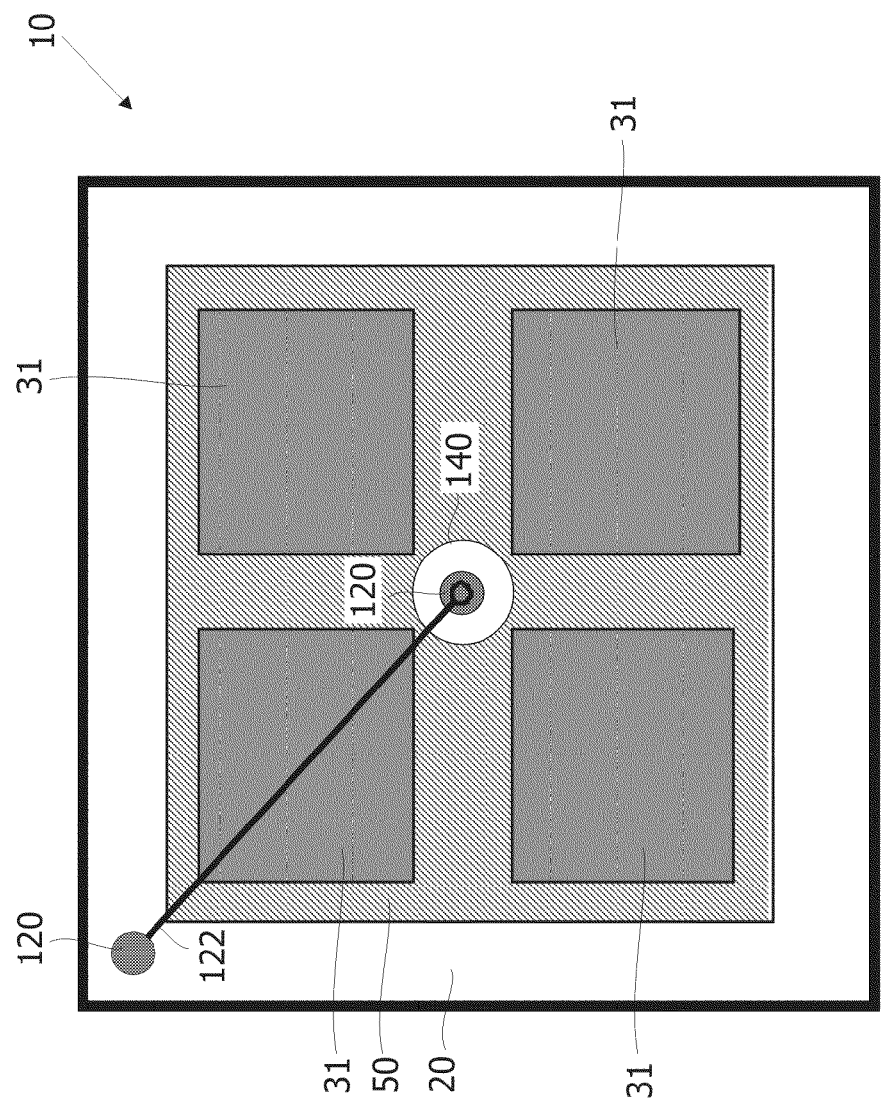

FIG. 10 shows an embodiment of the electroluminescent device 10 comprising a counter electrode with four different counter electrode segments 31. The counter electrode segments 31 are shown in a square arrangement, and the organic electroluminescent layer 50 is not covered by the counter electrode segments 31 across the entire electroluminescent device 10. In the center of the electroluminescent device 10 the counter electrode segments 31 form an area of the organic electroluminescent layer 50 without covering of the counter electrode segments 31. Within this area of the organic electroluminescent layer 50 an open area 140 is arranged, and within the open area 140 the electrical connecting means 120 is positioned. This electrical connecting means 120 is contacted to an electrical connecting means 120 in the outer area of the electroluminescent device 10 and connected to the inner electrical connecting means 120 by means of the electrical shunt means 122. The counter electrode segments 31 may be individually connected to a power source by contact means 60 applied to each counter electrode segment 31.

The described embodiments comprise as an example an organic electroluminescent layer 50 within the layer stack. In alternative embodiments within the scope of this invention, the electroluminescent layer stack may comprise layer additional to the organic electroluminescent layer 50 such as hole transparent layers, hole blocking layers, electron transport layers, electron blocking layers, charge injection layers, further conducting layers etc.

LIST OF NUMERALS 10 electroluminescent device
20 substrate electrode
21 contacting area
22 additional applied conductive material
30 counter electrode
31 counter electrode segment
40 substrate
50 organic electroluminescent layer
60 contact means
70 protective means
71 protective means
72 contiguous gap 90 encapsulation means
91 insulating rim
92 gas-tight feed through
93, 93' connection means
94 joint means
95 top of encapsulation means
96 side of encapsulation means
97 insulating means
98 insulating means
99 encapsulation cavity
120 connecting means
120' connecting means
122 shunt means
122' shunt means
122" shunt means
140 open area
170 getter
180 scattering means

The invention claimed is:

1. An electroluminescent device comprising:
a substrate;
a substrate electrode disposed on top of the substrate;
at least one stack of subsequent layers comprising a counter electrode and an electroluminescent layer stack with at least one organic electroluminescent layer;
at least one electrical shunt means configured to improve a current distribution within the substrate electrode; and
electrical connecting means configured to apply the shunt means to the substrate electrode,
wherein the electroluminescent layer stack is arranged between the substrate electrode and the counter electrode, and wherein the stack of subsequent layers has an open area in order to feed through the shunt means such that the electrical connecting means is encircled by the stack of subsequent layers, and the electrical connecting means and the shunt means are arranged externally of margins of the stack of subsequent layers.

2. Electroluminescent device according to claim 1, wherein the electrical connecting means comprises electrically conductive glue.

3. Electroluminescent device according to claim 2, wherein the conductive glue comprises a matrix comprising one or more organic materials and a filler comprising one or more inorganic materials.

4. Electroluminescent device according to claim 1, wherein the electrical connecting means is embedded in an electrical non-conductive protective means, applied to the substrate electrode.

5. Electroluminescent device according to claim 1, wherein the electrical shunt means is selected from the group consisting of: a wire, a metallic foil, a deposited conductive material and a printed circuit board.

6. Electroluminescent device according to claim 1, wherein the substrate electrode has a contacting area, and wherein said further electrical connecting means is applied to the substrate electrode within the contacting area.

7. Electroluminescent device according to claim 6, wherein the contacting area comprises an additional applied conductive material, configured to increase the electrical conductivity of the substrate electrode in said contacting area.

8. Electroluminescent device according to claim 1, further comprising at least one contact means for electrically contacting the counter electrode to an electrical power source, said contact means comprising conductive glue applied to the counter electrode and arranged on the substrate electrode at least partially covered below the contact means with a protective means comprising electrically non-conductive glue.

9. Electroluminescent device according to claim 8, further comprising an encapsulation means for encapsulating at least the electroluminescent layer stack, wherein said contact means is arranged for electrically contacting the counter electrode to the encapsulation means.

10. Electroluminescent device according to claim 9, wherein the encapsulation means comprises a top of encapsulation means and a side of encapsulation means electrically insulating the contact means from the substrate electrode, wherein the electrically contacting of the counter electrode to the encapsulation means by said contact means is provided to the at least partly conductive top of encapsulation means.

11. Electroluminescent device according to claim 9, wherein at least one electrical shunt means is arranged between the electrical connecting means and the encapsulation means extending to the at least partly conductive inner surface of the encapsulation means for electrically contacting the substrate electrode via the inner surface of the encapsulation means, the shunt means having a spike form and the shunt means being attached to the encapsulation means.

12. Electroluminescent device according to claim 8, wherein the electrical conductive glue forming the electrical connecting means and/or said protective means comprises at least one scattering means at least for scattering light, generated by the organic electroluminescent layer.

* * * * *